United States Patent [19]
Omote et al.

[11] Patent Number: 5,851,736
[45] Date of Patent: *Dec. 22, 1998

[54] HEAT-RESISTANT PHOTORESIST COMPOSITION, PHOTOSENSITIVE SUBSTRATE, AND PROCESS FOR FORMING HEAT-RESISTANT POSITIVE OR NEGATIVE PATTERN

[75] Inventors: Toshihiko Omote; Shun-ichi Hayashi; Hirofumi Fujii, all of Osaka, Japan

[73] Assignee: Nitto Denko Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 769,829

[22] Filed: Dec. 20, 1996

Related U.S. Application Data

[60] Division of Ser. No. 248,535, May 24, 1994, which is a continuation-in-part of Ser. No. 835,535, Feb. 14, 1992, abandoned, and Ser. No. 86,084, Jul. 6, 1993, abandoned.

[30] Foreign Application Priority Data

| Mar. 5, 1991 | [JP] | Japan | 3-65634 |
| Apr. 4, 1991 | [JP] | Japan | 3-71767 |
| Apr. 15, 1991 | [JP] | Japan | 3-111163 |
| Jul. 7, 1992 | [JP] | Japan | 4-179685 |
| Oct. 26, 1992 | [JP] | Japan | 4-287384 |

[51] Int. Cl.$^6$ ............... G03F 7/40; G03F 7/004
[52] U.S. Cl. ........... 430/325; 430/270.1; 430/283.1; 430/326; 430/330; 430/906; 430/920
[58] Field of Search ............... 430/270.1, 283.1, 430/325, 326, 906, 919, 920, 330; 522/36, 39, 50

[56] References Cited

U.S. PATENT DOCUMENTS

| 3,890,152 | 6/1975 | Ruckert et al. | 430/325 |
| 3,901,710 | 8/1975 | Ranz et al. | 430/325 |
| 4,181,531 | 1/1980 | Pilz | 430/270.1 |
| 4,242,437 | 12/1980 | Rohloff | 430/270.1 |
| 4,243,741 | 1/1981 | Abele et al. | 430/270.1 |
| 4,243,743 | 1/1981 | Hiramoto et al. | 430/330 |
| 4,358,529 | 11/1982 | Abele | 430/270.1 |
| 4,416,973 | 11/1983 | Goff | 430/281.1 |
| 4,430,918 | 2/1984 | Goff | 430/281.1 |
| 4,491,628 | 1/1985 | Ito et al. | 430/270.1 |
| 4,565,767 | 1/1986 | Kataoka et al. | 430/197 |
| 4,604,340 | 8/1986 | Grossa | 430/270.1 |
| 4,880,772 | 11/1989 | Moreau et al. | 430/192 |
| 4,927,736 | 5/1990 | Mueller et al. | 430/275.1 |
| 5,081,000 | 1/1992 | Kuehn et al. | 430/281.1 |
| 5,114,826 | 5/1992 | Kwong et al. | 430/197 |
| 5,206,117 | 4/1993 | Labadie et al. | 430/325 |
| 5,326,792 | 7/1994 | Masaki et al. | 522/135 |
| 5,348,835 | 9/1994 | Oba et al. | 430/330 |
| 5,449,584 | 9/1995 | Banba et al. | 430/190 |
| 5,665,523 | 9/1997 | Omote et al. | 430/282.1 |

FOREIGN PATENT DOCUMENTS

| 0262446 | 4/1988 | European Pat. Off. . | |
| 0378156 | 7/1990 | European Pat. Off. . | |
| 0436457 | 7/1991 | European Pat. Off. . | |
| 0502400 | 9/1992 | European Pat. Off. | 430/270.1 |
| 2197189 | 3/1974 | France . | |
| 335309 | 8/1984 | Germany . | |
| 4007236 | 9/1990 | Germany . | |
| 0287796 | 3/1991 | Germany | 430/914 |
| 49-60733 | 6/1974 | Japan . | |
| 54-145794 | 11/1979 | Japan . | |
| 56-38038 | 4/1981 | Japan . | |
| 58-223147 | 12/1983 | Japan . | |
| 59-108031 | 6/1984 | Japan . | |
| 59-219330 | 12/1984 | Japan . | |
| 59-220730 | 12/1984 | Japan . | |
| 59-231533 | 12/1984 | Japan . | |
| 59-232122 | 12/1984 | Japan . | |
| 60-6729 | 1/1985 | Japan . | |
| 60-72925 | 4/1985 | Japan . | |
| 60-135457 | 7/1985 | Japan . | |
| 60-135934 | 7/1985 | Japan . | |
| 61-57620 | 3/1986 | Japan . | |

OTHER PUBLICATIONS

Yamaoko et al., "Photochemical Behavior . . . ", Journal of Imaging Science, vol. 34, pp. 50–54 (Mar. 1990).
Polymer Preprints, Japan, vol. 39, No. 8 (1990).
Concise Explanation of Relevancy for JP–A–49–60733.
Concise Explanation of Relevancy for JP–A–58–223147.

Primary Examiner—Janis L. Dote
Attorney, Agent, or Firm—Sughrue, Mion, Zinn, Macpeak & Seas, PLLC

[57] ABSTRACT

A heat-resistant photoresist composition comprising a polyimide precursor having a structural unit represented by formula (I):

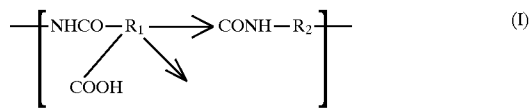

wherein the arrows, $R_1$, and $R_2$ are the same as defined hereinbefore, and a compound which becomes basic upon irradiation with actinic rays, for example, represented by formula (II):

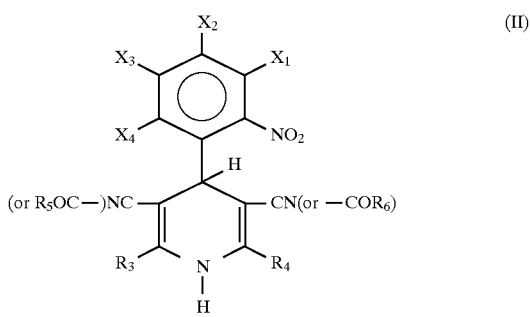

wherein $R_3$ to $R_6$ and $X_1$ to $X_4$ are the same as defined hereinbefore, a photosensitive substrate obtained by coating a substrate with the heat-resistant composition, and a process for forming a pattern using the heat-resistant negative photoresist composition.

3 Claims, No Drawings

HEAT-RESISTANT PHOTORESIST COMPOSITION, PHOTOSENSITIVE SUBSTRATE, AND PROCESS FOR FORMING HEAT-RESISTANT POSITIVE OR NEGATIVE PATTERN

CROSS REFERENCE TO THE RELATED APPLICATIONS

This application is a divisional of U.S. patent application Ser. No. 08/248,535, filed May 24, 1994, which is a continuation-in-part application of U.S. patent application Ser. No. 07/835,535 filed Feb. 14, 1992, now abandoned, and U.S. patent application Ser. No. 08/086,084 filed Jul. 6, 1993, now abandoned.

FIELD OF THE INVENTION

The present invention relates to a heat-resistant photoresist composition, a photosensitive substrate obtained using the composition, and a process for forming a heat-resistant positive or negative pattern.

BACKGROUND OF THE INVENTION

Photosensitive polyimides or precursors thereof which have been in common practical use because of their heat resistance are mostly of a negative-working type which becomes less soluble in developing solutions upon irradiation with actinic rays to form a desired relief image on various substrates.

Many kinds of heat-resistant photoresists and applications thereof have been proposed which photoresists employ such a negative photosensitive polyimide or precursor thereof and leave actinic ray-irradiated areas on substrates. For example, negative photoresists conventionally proposed include:

(1) Photoresists comprising a polyimide precursor having introduced therein a methacryloyl group through an ester bond or ionic bond (JP-A-49-11541, JP-A-50-40922, JP-A-54-145794, and JP-A-56-38038) (The term "JP-A" as used herein means an "unexamined published Japanese patent application".);

(2) Photoresists comprising a soluble polyimide containing a photopolymerizable olefin (JP-A-59-108031, JP-A-59-220730, JP-A-59-232122, JP-A-60-6729, JP-A-60-72925, and JP-A-61-57620);

(3) Photoresists comprising a self-sensitizing polyimide having a benzophenone skeleton and containing an alkyl group at the ortho position of an aromatic ring to which a nitrogen atom is bonded (JP-A-59-219330 and JP-A-59-231533); and (4) Photoresist comprising a polybenzoxazole precursor having heat resistance almost equal to that of polyimides (Polymer Society Annual Meeting Preprints, p. 664, 1988).

On the other hand, examples of positive photoresists conventionally proposed include:

(5) Photoresist comprising a polyimide precursor having introduced therein an o-nitrobenzyl group through an ester bond (J. Macromol. Sci. Chem., A24, 10, 1407, 1987);

(6) Photoresists comprising a mixture of either a soluble hydroxyimide or a polyoxazole precursor and a naphthoquinone diazide compound (JP-B-64-60630 and U.S. Pat. No. 4,395,482) (The term "JP-B" as used herein means an "examined Japanese patent publication".);

(7) Photoresist comprising a soluble polyimide having introduced therein naphthoquinone diazide through an ester bond (Macromolecules, 23, 1990);

(8) Photoresist employing a chemical amplification-type polyimide (U.S. Pat. No. 5,053,314); and (9) Photoresist comprising a mixture of a polyimide precursor and naphthoquinone diazide (JP-A-52-13315).

However, the conventional negative photoresists described above have a problem on a resolving power in its function and further have a problem in some applications that use of these negative photoresists leads to low yields of products. In addition, photoresists (2), (3), and (4) above are disadvantageous in that they are not suitable for use as a multipurpose photoresist since polymers which can be used therein are limited in structure and, hence, the properties of coating films finally obtained therefrom are limited. On the other hand, the conventional positive photoresists also have the problem of poor sensitivity and resolution as in photoresist (5) above, which are attributable to an absorption wavelength for a photosensitizer, while photoresists (6), (7), and (8) also have the same problems as in photoresists (2), (3), and (4) above because polymers or polymer precursors used therein are also limited in structure. Further, photoresist (9) above has a problem of film thickness reduction (to an initial thickness) in high temperature treatment conducted after pattern formation, so that it has not yet been put to practical use.

In order to eliminate the above-described problems accompanying the conventional photoresist compositions, the present inventors have already developed a chemical amplification-type, positive-working photosensitive polyimide resin composition having an acyloxy group, showing excellent sensitivity and resolution (JP-A-3-763). This photoresist composition, however, is disadvantageous in that since the hydroxyl-protecting group thereof is limited to acyloxy group, ionic impurities contaminate into the polyimide resin during synthesis of the resin, and purification of the product for removing these impurities necessitates much time and cost.

On the other hand, a photosensitive material comprising a polyimide precursor and N-methylolacrylamide incorporated therein has been proposed (Polymer Preprint Japan, 39 (8), 2397 (1990)). This composition, however, has problems, for example, that it has poor dimensional stability because the residual film thickness is 50% as in the above-described case, and that the pre-baking thereof requires much time.

SUMMARY OF THE INVENTION

As a result of intensive studies on the above photoresist composition, it has now been found that a photoresist composition which overcomes the problems of the conventional photoresists can be obtained by blending a specific polyimide precursor and a compound which becomes basic upon irradiation with actinic rays. The present invention has been completed based on this finding.

One object of the present invention is to provide a heat-resistant photoresist composition showing good sensitivity and resolving power in which the polyimide precursor which imparts photosensitivity can have any polymeric structure in the starting material thereof, which overcomes the problems of the conventional photoresists.

Another object of the present invention is to provide a photosensitive substrate employing the above heat-resistant photoresist composition.

Still another object of the present invention is to provide a process for forming a heat-resistant positive or negative pattern using the above heat-resistant photoresist composition.

The heat-resistant photoresist composition according to the present invention comprises a polyimide precursor having a structural unit represented by formula (I):

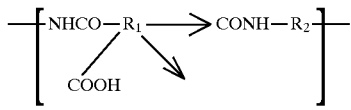

wherein the arrow each indicates a bond which can be substituted by isomerization, $R_1$ represents a tetravalent aromatic or aliphatic hydrocarbon residue, $R_2$ represents a divalent aromatic or aliphatic hydrocarbon residue, and a compound which becomes basic upon irradiation with actinic rays.

The photosensitive substrate according to the present invention is a photosensitive substrate obtained by coating a surface of a substrate with the above heat-resistant photoresist composition.

DETAILED DESCRIPTION OF THE INVENTION

Representative examples of $R_1$ in the structural units represented by the formula (I) described above include tetravalent aromatic or aliphatic residues having a skeleton such as benzene, naphthalene, perylene, diphenyl, diphenyl ether, diphenyl sulfone, diphenylpropane, diphenylhexafluoropropane, benzophenone, butane, and cyclobutane. However, $R_1$ is not limited to these residues. Preferred examples of $R_1$ are tetravalent residues having diphenyl or benzophenone skeleton. In all the structural units represented by the formula (I), it is not necessary for $R_1$ to be the same, and if required and necessary, two or more different $R_1$ can be included.

Representative examples of $R_2$ in the structural units represented by the formula (I) include divalent aromatic or aliphatic residues having a skeleton such as diphenyl ether, diphenyl thioether, benzophenone, diphenylmethane, diphenylpropane, diphenylhexafluoropropane, diphenyl sulfoxide, diphenyl sulfone, biphenyl, pyridine, and benzene. However, $R_2$ is not limited to these residues. Preferred examples of $R_2$ are divalent residues having diphenyl ether, diphenyl sulfone or benzene skeleton. In all the structural units represented by the formula (I), it is not necessary for R2 to be the same, and if required and necessary, two or more different $R_2$ can be included.

Specific examples of the polyimide precursor containing a structural unit represented by the formula (I) include those having the following structural units:

The polyimide precursor having a structural unit represented by the formula (I) can be obtained by, for example, the following method.

An aromatic or aliphatic tetracarboxylic dianhydride containing $R_1$, in the molecule thereof and an aromatic or aliphatic diamine containing $R_2$ in the molecule thereof are reacted in almost equimolar amounts in an organic solvent such as N-methyl-2-pyrrolidone, dimethylacetamide, dimethylformamide, dimethyl sulfoxide, hexamethylphosphoramide, or the like.

Examples of the compound which becomes basic upon irradiation with actinic rays which can be used in the present invention is a compound represented by formula (II):

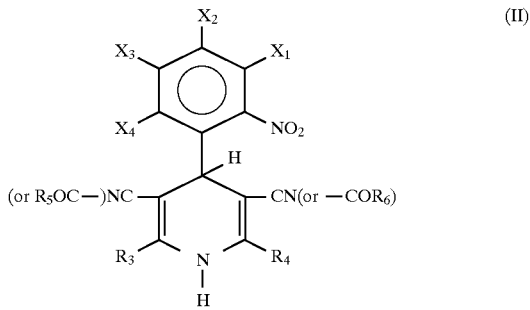

wherein $R_3$ and $R_4$ each represents hydrogen atom or an alkyl group having 1 to 3 carbon atoms, $R_5$ and $R_6$ each is an alkyl group having 1 to 4 carbon atoms or an alkoxy group having 1 to 4 carbon atoms, and $X_1$ and $X_4$ each is one member selected from the group consisting of hydrogen atom, fluorine atom, nitro group, methoxy group, a dialkylamino group, amino group, cyano group, and a fluoroalkyl group.

Compounds within the scope of formula (II) are represented by formula (IIa):

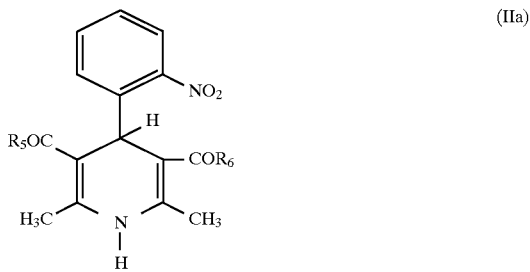

wherein $R_5$ and $R_6$ are as defined above.

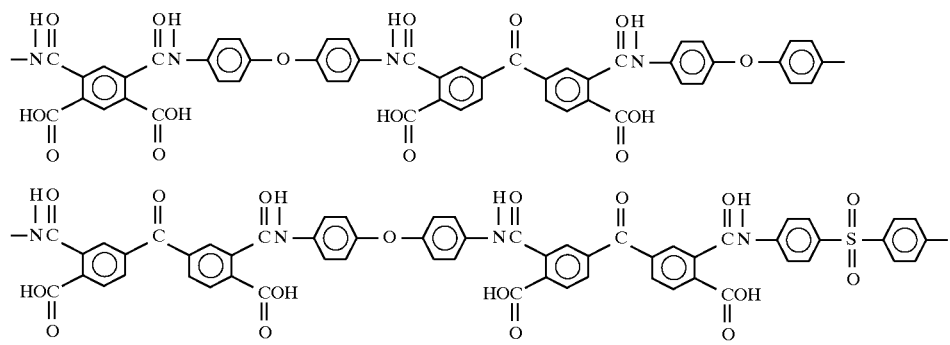

Preferred examples of the compound which becomes basic upon irradiation with actinic rays are 2,6-dimethyl-3,5-dicarboxy-4-(2'-nitrophenyl)-1,4-dihydropyridine derivatives represented by the structural formula (III)

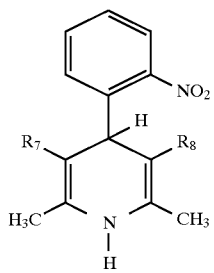

(III)

wherein $R_7$ and $R_8$ each is methylcarbonyl group, or cyano group.

More preferred examples of the compound which becomes basic upon irradiation with actinic rays are 2,6-dimethyl-3,5-dicyano-4-(2'-nitrophenyl)-1,4-dihydropyridine, 2,6-dimethyl-3,5-diacetyl-4-(2'-nitrophenyl)-1,4-dihydropyridine or 2,6-dimethyl-3,5-diacetyl-4-(2',4'-dinitrophenyl)-1,4-dihydropyridine.

The compound represented by the formula (III) can be obtained by, for example, reacting a substituted benzaldehyde with 2 mol of aminocrotonitrile per mol of the benzaldehyde in glacial acetic acid with refluxing, or reacting a substituted benzaldehyde with 2 mol of acetylacetone and 1 mol of ammonia per mol of the benzaldehyde in methanol. Alternatively, the desired compound can be obtained by the conventional method for synthesizing 1,4-dihydropyridine derivatives (e.g., J. Chem. Soc., 1931, 1835, 1931).

The compound which becomes basic upon irradiation with actinic rays can be used alone or as mixtures thereof.

Examples of the actinic rays are ultraviolet rays, visible rays and the like.

The addition amount of the compound which becomes basic upon irradiation with actinic ray is from 5 to 50 parts by weight, preferably from 10 to 25 parts by weight, per 100 parts by weight of the polyimide precursor. If the amount of the compound added is too small, photosensitive films obtained from the resulting photoresist composition tend to show poor solubility contrast (difference on dissolution rate to an alkali between exposed portion and unexposed portion). If the amount thereof is too large, there are cases that the storage stability of the resulting photoresist solution and the image-forming properties thereof are adversely affected, and that the film thickness reduction becomes large when the patterned films are subjected to heat treatment after the pattern formation.

The heat-resistant photoresist composition of the present invention can contain a dissolution accelerator represented by formula (IV):

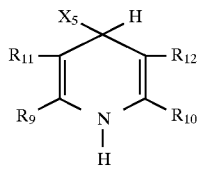

(IV)

wherein $R_9$ and $R_{10}$ each represents hydrogen atom or an alkyl group having 1 to 3 carbon atoms, $R_{11}$ and $R_{12}$ each is one member selected from the group consisting of hydrogen atom, cyano group, acetyl group, amide group, and a group of the formula $COOR_{13}$ wherein $R_{13}$ is one member selected from the group consisting of an alkyl group having 1 to 5 carbon atoms, an alkoxyl group having 1 to 5 carbon atoms, anilino group, toluidino group, and benzyloxy group, and $X_5$ is one member selected from the group consisting of hydrogen atom, fluorine atom, an alkyl group having 1 to 3 carbon atoms, a fluoroalkyl group, and phenyl group.

The dissolution accelerator of the formula (IV) which can be contained in the composition is not activated at all by irradiation with actinic rays. It, however, has the effect of accelerating the rate of dissolution of unexposed areas during development, to thereby improve the developing rate and make the composition practically useful.

Preferred examples of the compound of the formula (IV) include 2,6-dimethyl-3,5-dicyano-4-methyl-1,4-dihydropyridine and 2,6-dimethyl-3,5-dicyano-1,4-dihydropyridine.

The amount of the compound of the formula (IV) added as a dissolution accelerator is from 5 to 50 parts by weight, preferably from 5 to 15 parts by weight, per 100 parts by weight of the polyimide precursor having a structural unit represented by the formula (I). If the amount of the dissolution accelerator added is too small, acceleration of the dissolution of the polyimide precursor in unexposed areas is not expected in development. Too large amounts thereof are undesirable in that a considerable decrease in film thickness may result from the final heat cure or that dissolution inhibition ability of exposed areas may deteriorate.

The heat-resistant photoresist composition of the present invention can further contain conventional photosensitizers and the like.

One example of the process for forming an image having a positive pattern using the heat-resistant photoresist composition of the present invention is described below.

The polyimide precursor having a structural unit represented by formula (I) and the compound which becomes basic upon irradiation with actinic rays are dissolved in an organic solvent such as N-methyl-2-pyrrolidone, dimethylacetamide, dimethylformamide, dimethyl sulfoxide, hexamethylphosphoramide, or the like which are described hereinabove, to prepare a photosensitive liquid.

The photosensitive liquid thus prepared is coated on an appropriate substrate at a dry thickness of from 1 to 30 $\mu$m, and preferably from 3 to 10 $\mu$m.

The resulting coating is dried (e.g., 80° C. and about 10 minutes) to form a film on the substrate.

The resulting film is exposed to light through an ordinary photomask.

After the light exposure, the light exposed film is heat-treated at a temperature of about 170° C. or less (e.g., about 80°–160° C.).

The heat-treated film is subjected to a developing treatment with an alkaline developing solution to remove exposed areas. The development is conducted by an immersion method, a spraying method, or the like. Examples of the alkaline developing solution which can be used are aqueous alkaline solutions of inorganic bases such as sodium hydroxide, potassium hydroxide, and the like and aqueous alkaline solutions of organic bases such as propylamine, butylamine, monoethanolamine, tetramethylammonium hydroxide (hereinafter referred to as TMAH), choline, and the like. These bases may be used alone or in combination of two or more thereof. To this aqueous alkaline solution, an organic solvent such as an alcohol or a surfactant selected from various kinds can be added if required and necessary.

After development, the resulting film is washed with a rinsing liquid to obtain an image having the desired positive pattern.

The thus-obtained image-bearing film is subjected to a final high temperature heat treatment (about 200° to 400°

C.), thereby obtaining an image-bearing polyimide resist having heat resistance.

One example of the process for forming an image having a negative pattern using the heat-resistant photoresist composition of the present invention is described below.

The polyimide precursor having a structural unit represented by formula (I) and the compound which becomes basic upon irradiation with actinic rays are dissolved in an organic solvent such as N-methyl-2-pyrrolidone, dimethylacetamide, dimethylformamide, dimethyl sulfoxide, hexamethylphosphoramide, or the like, to prepare a photosensitive liquid.

The photosensitive liquid thus prepared is coated on an appropriate substrate at a dry thickness of from 1 to 30 μm, and preferably from 10 to 20 μm.

The resulting coating is dried (e.g., 80° C. and about 10 minutes) to form a film on the substrate.

The resulting film is exposed to light through an ordinary photomask.

After the light exposure, the light exposed film is heat-treated at a temperature of about 170° C. or more (e.g., about 170°–200° C.).

The heat-treated film is subjected to a developing treatment with an alkaline developing solution to remove unexposed areas. The development is conducted by an immersion method, a spraying method, or the like. Examples of the alkaline developing solution are the same as in the positive pattern forming method.

After development, the resulting film is washed with a rinsing liquid to obtain an image having the desired negative pattern.

The thus-obtained image-bearing film is subjected to a final high temperature heat treatment (about 200° to 400° C.), thereby obtaining an image-bearing polyimide resist having heat resistance.

As described above, since the heat-resistant photoresist composition of the present invention employs a polyimide precursor having a specific structure, irradiation of the composition with actinic ray such as ultraviolet ray yields a carboxyl or hydroxyl group in the structural unit and, as a result, the polymer component in the photoresist composition becomes alkali-soluble and the photoresist composition shows high sensitivity and high resolving power which have not been attained with conventional heat-resistant photoresist compositions. Thus, practically useful positive or negative patterns can be formed.

A further advantage of the present invention is that since the polyimide resist finally obtained through high-temperature heat treatment has excellent heat resistance, electrical properties, and mechanical properties, it can be advantageously used in the semiconductor industry as a protective film for solid elements or circuit substrates or as a material for forming insulating films.

The present invention will be explained below in more detail by reference to the following examples, but the invention is not construed as limiting thereto.

EXAMPLE 1

Tetracarboxylic dianhydrides respectively having the hydrocarbon residues $R_1$ shown in Table 1 and diamines respectively having the hydrocarbon residues $R_2$ shown in Table 1 were reacted in almost equimolar amounts at room temperature for 24 hours in dimethylacetamide, thereby obtaining polyimide precursor solutions 1 to 5 having a structural unit represented by the above-described formula (I).

On the other hand, 2-nitrobenzaldehyde was mixed with methyl acetoacetate (or ethyl acetoacetate) in an amount of 2.2 times the mole of the 2-nitrobenzaldehyde. Methyl alcohol having a temperature of −10° C. was added thereto in an amount of 5–6 times the weight of 2-nitrobenzaldehyde, and the resulting mixture was stirred for several minutes. 25 wt % Aqueous ammonia solution was added to the solution with stirring in an amount such that the amount of ammonia became 1.5 times the mole of 2-nitrobenzaldehyde. This mixture was refluxed with heating for 5 hours, and the resulting reaction product was separated and purified by recrystallization or column chromatography. Thus, 2,6-dimethyl-3,5-dicarboxymethyl-4-(2'-nitrophenyl)-1,4-dihydropyridine (P-Me) or 2,6-dimethyl-3,5-dicarboxyethyl-4-(2'-nitrophenyl)-1,4-dihydropyridine (P-Et) was obtained.

Either of the thus-prepared two compounds was added to each of the above-obtained polyimide precursors in an amount shown in Table 2.

Each of the resulting solutions was spin-coated on a silicon wafer and dried at 80° C. to form a film having a thickness of from 3 to 5 μm. The film was then exposed through a glass mask to light emitted by a 250 W super-high-pressure mercury lamp placed at a distance of 30 cm from the film, for 3 minutes by means of vacuum contact exposure.

After the exposure, each resulting film was heated at 150° C. for 10 minutes, developed for 3 minutes with a 1.5 wt % aqueous solution of tetramethylammonium hydroxide, and then rinsed with water. The resolution of each of the thus-prepared patterned films and the ratio of remaining film thickness thereof to initial film thickness after high-temperature heating (350° C./1 hr) are shown in Table 2. These five patterned films according to the present invention all showed values on or above practical levels.

EXAMPLE 2

Using polyimide precursor solution 2 shown in Table 1, image formation was conducted in the same manner as in Example 1 except that the post-heating step was conducted prior to the exposure step.

As a result, a patterned film could be obtained which had good properties almost equal to those of the film obtained by using polyimide precursor 2 and light-exposing and then heating the same.

TABLE 1

| Polyimide Precursor No. | $R_1$ | $R_2$ |
| --- | --- | --- |
| 1 |  (100 parts) | 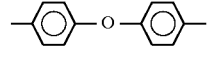 (100 parts) |
| 2 |  (100 parts) | Same as the above (100 parts) |
| 3 | Same as the above (100 parts) | $R_2$ of No. 1 (70 parts)/  (30 parts) |

TABLE 1-continued

| Polyimide Precursor No. | $R_1$ | $R_2$ |
|---|---|---|
| 4 | $R_1$ of No. 2 (90 parts)/ 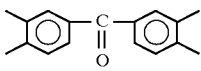 (10 parts) | 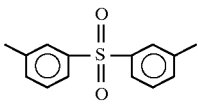 (100 parts) |
| 5 | 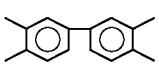 (100 parts) | Same as the above (100 parts) |

TABLE 2

| Precursor No. in Table 1 | Kind of compound (by weight per 100 parts by weight of solid resin) | Resolution (aspect ratio) | Ratio of remaining film thickness to initial film thickness (%) |
|---|---|---|---|
| 1 | P-Me*[1] (15 parts) | 1.0 | 70 |
| 2 | P-Me (20 parts) | 0.8 | 73 |
| 3 | P-Me (25 parts) | 0.8 | 68 |
| 4 | P-Et*[2] (15 parts) | 0.9 | 75 |
| 5 | P-Et (20 parts) | 1.1 | 75 |

*[1]P-Me: 2,6-Dimethyl-3,5-dicarboxymethyl-4-(2'-nitrophenyl)-1,4-dihydropyridine
*[2]P-Et: 2,6-Dimethyl-3,5-dicarboxyethyl-4-(2'-nitrophenyl)-1,4-dihydropyridine Comparative Example 1

A polyimide precursor having a structural unit represented by formula (I) wherein $R_1$ is

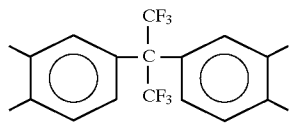

and $R_2$ is

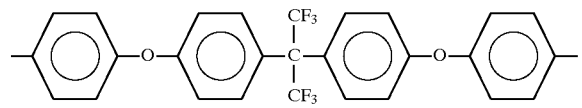

was subjected to ring closure by a conventional chemical imide-forming method (acetic anhydride, pyridine method), thereby synthesizing a soluble polyimide shown by the following formula.

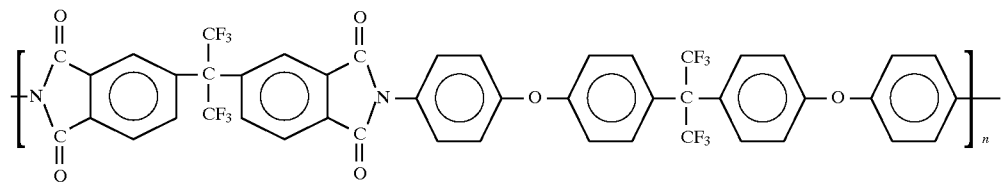

To 100 parts by weight of this polyimide was added 20 parts by weight of P-Me. Image formation was attempted using the resulting mixture in the same manner as in Example 1, but the final film had no contrast at all.

Comparative Example 2

To 100 parts by weight of polyimide precursor 2 shown in Table 1 was added 20 parts by weight of the compound of the formula

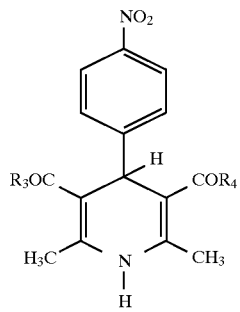

which is an isomer of P-Me. Using the resulting mixture, image formation was attempted in the same manner as in Example 1. However, despite of irradiation with light, the compound of the above formula did not cause a rearrangement reaction, and image formation was difficult.

EXAMPLE 3

Biphenyltetracarboxylic dianhydride was reacted with an almost equimolar amount of p-phenylenediamine at room temperature for 24 hours in dimethylacetamide at a monomer concentration of 20% by weight, thereby obtaining a solution of a polyimide precursor having a structural unit represented by the formula (I).

To 100 parts by weight, on a solid basis, of the thus-obtained polyimide precursor solution was added 30 parts by weight of the compound represented by the formula (II) wherein $R_3$ and $R_4$ each was methyl group and $X_1$, $X_2$, $X_3$, and $X_4$ each was hydrogen atom (hereinafter referred to as "o-NCN"). The compound added was uniformly dissolved in the solution.

This solution was applied on a silicon wafer with a spin coater at 2,200 rpm for 20 seconds, and predried on an 80° C. hot plate for 10 minutes to form a film having a dry thickness of about 18 μm. The film was then exposed through a glass mask to a 436 nm actinic ray emitted by a 250 W super-high-pressure mercury lamp placed at a distance of 30 cm from the film and which had been filtered through a glass filter for 3 minutes by means of vacuum contact exposure.

After the exposure, the resulting film was heated at 185° C. for 10 minutes, developed for 4 minutes with a developing solution composed of 3 wt % aqueous tetramethylammonium hydroxide solution and methyl alcohol (2/1 by volume), and then rinsed with water. As a result, a negative pattern was obtained in which only the irradiated areas remained distinctly on the substrate.

This pattern was subjected to high-temperature heating (400° C. for 2 hours) for imidization. As a result, the percentage of the residual film thickness to the initial film thickness was about 75%. The polyimide film finally obtained was of a brown color and showed various properties which were well on practical levels.

EXAMPLE 4

A negative pattern was formed in the same manner as in Example 3 except that the organic solvent used for polyimide precursor synthesis was changed from dimethylacetamide to N-methyl-2-pyrrolidone.

Although the predrying required a temperature of 100° C., the pattern obtained had good properties as in Example 3.

EXAMPLE 5

A negative pattern was formed in the same manner as in Example 3 except that in place of o-NCN, the compound represented by the formula (II) wherein $R_3$ and $R_4$ each was methyl group, $X_1$, $X_3$, and $X_4$ each was hydrogen atom, and $X_2$ was nitro group (hereinafter referred to as "2,4-NCN") was used in the same amount. The pattern thus obtained had good properties as in Example 3.

Comparative Example 3

A pattern was formed in the same manner as in Example 3 except that in place of o-NCN, the compound represented by the formula (II) wherein $R_3$ and $R_4$ each was methyl group, $X_1$, $X_3$, and $X_4$ each was hydrogen atom, $X_2$ was nitro group, and the cyano group at each of the 3- and 5-positions in the 1,4-dihydropyridine ring had been replaced by—$COOCH_3$ (hereinafter referred to as "2,4-NE") was used in the same amount, and that the post-exposure heating was conducted at 165° C. for 10 minutes. However, the pattern thus obtained was a positive pattern in which the unirradiated areas remained on the substrate.

EXAMPLE 6

A negative pattern was formed in the same manner as in Example 3 except that in place of o-NCN, the compound represented by the formula (II) wherein $R_3$, $R_4$, $R_5$, and $R_6$ each was methyl group and $X_1$, $X_2$, $X_3$, and $X_4$ each was hydrogen atom (hereinafter referred to as "o-NA") was used in the same amount. The pattern thus obtained had good properties as in Example 3.

EXAMPLE 7

A negative pattern was formed in the same manner as in Example 6 except that the organic solvent used for polyimide precursor synthesis was changed from dimethylacetamide to N-methyl-2-pyrrolidone.

Although the predrying required a temperature of 100° C., the pattern obtained had good properties as in Example 6.

EXAMPLE 8

A negative pattern was formed in the same manner as in Example 6 except that in place of o-NA, the compound represented by the formula (II) wherein $R_3$, $R_4$, $R_5$, and $R_6$ each was methyl group, $X_1$, $X_3$, and $X_4$ each was hydrogen atom, and $X_2$ was nitro group (hereinafter referred to as "2,4-NA") was used in the same amount. The pattern thus obtained had good properties as in Example 6.

Comparative Example 4

A pattern was formed in the same manner as in Example 6 except that in place of o-NA, 2,4-NE was used as in Comparative Example 3 in the same amount, and that the post-heating was conducted at 165° C. for 10 minutes. However, the pattern thus obtained was a positive pattern in which the unirradiated areas remained on the substrate.

EXAMPLE 9

To 100 parts by weight, on a solid basis, of the polyimide precursor solution obtained in Example 3 were added 20 parts by weight of the compound represented by the formula (II) wherein $R_3$ and $R_4$, each was methyl group, $X_1$, $X_2$, $X_3$, and $X_4$ each was hydrogen atom, and $R_5$ and $R_6$ each was methyl group (hereinafter referred to as "DAc") and 10 parts by weight of the compound represented by the formula (IV) wherein $X_5$ was methyl group, $R_9$ and $R_{10}$ each was methyl group, and $R_{11}$ and $R_{12}$ each was cyano group (hereinafter referred to as "$CH_3$—CN"). The compounds added were uniformly dissolved in the solution.

A negative pattern was then formed in the same manner as in Example 3 except that the solution obtained above was used. This pattern was subjected to high-temperature heating (400° C. for 2 hours) for imidization. As a result, the percentage of the residual film thickness to the initial film thickness was about 75%. The developing rate was as high as about 1.5 to 2 times that in Example 3. The polyimide film finally obtained was of a brown color and showed various properties which were well on practical levels.

EXAMPLE 10

A negative pattern was formed in the same manner as in Example 3 except that in place of DAc used in Example 9, the compound represented by the formula (II) wherein $R_3$ and $R_4$ each was methyl group, $X_1$, $X_3$, and $X_4$ each was hydrogen atom, $X_2$ was nitro group, and $R_5$ and $R_6$ each was methoxy group (hereinafter referred to as "2,4-DEs") was used in the same amount. The pattern thus obtained had good properties as in Example 9.

EXAMPLE 11

A negative pattern was formed in the same manner as in Example 9 except that in place of DAc, the compound represented by the formula (II) wherein $R_3$ and R4 each was methyl group, $X_1$, $X_3$, and $X_4$ each was hydrogen atom, $X_2$ was nitro group, and $R_5$ and $R_6$ each was methyl group (hereinafter referred to as "2,4-DAc") was used in the same amount, and that the post-heating was conducted at 200° C. for 10 minutes.

The pattern thus obtained had good properties as in Example 9.

EXAMPLE 12

A negative pattern was formed in the same manner as in Example 9 except that the post-heating was conducted at 130° C. for 10 minutes and then at 200° C. for 10 minutes.

This pattern was subjected to high-temperature heating at 360° C. for 2 hours for imidization. The polyimide film thus obtained was superior in mechanical strength to that obtained in Example 9.

EXAMPLE 13

A negative pattern was formed in the same manner as in Example 9 except that the pre-baking was conducted at 90° C. for 30 minutes. This pattern was subjected to high-temperature heating for imidization in the same manner as in Example 12. The polyimide film thus obtained was superior in mechanical strength to that obtained in Example 9.

While the invention has been described in detail and with reference to specific examples thereof, it will be apparent to one skilled in the art that various changes and modifications can be made therein without departing from the spirit and scope thereof.

What is claimed is:

1. A process for forming a negative pattern which comprises coating a photosensitive liquid on a substrate, said photosensitive liquid being prepared by dissolving a heat-resistant photoresist composition in an organic solvent, the photoresist composition comprising a polyimide precursor having a structural unit represented by formula (I):

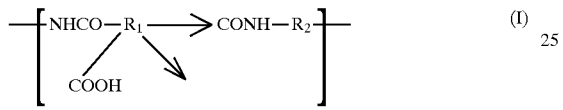

wherein the arrows each indicate a bond which can be substituted by isomerization, $R^1$ represents a skeleton of benzene, naphthalene, perylene, diphenyl, diphenyl ether, diphenyl sulfone, diphenylpropane, diphenylhexafluoropropane, benzophenone, butane or cyclobutane, and $R^2$ represents a skeleton of diphenyl ether, diphenyl thioether, benzophenone, diphenylmethane, diphenylpropane, diphenylhexafluoropropane, diphenyl sulfoxide, diphenyl sulfone, biphenyl, pyridine or benzene, and a compound represented by formula (IIa):

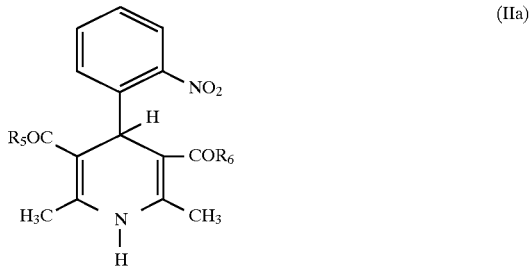

wherein $R_5$ and $R_6$ each represent an alkyl group having 1 to 4 carbon atoms or an alkoxy group having 1 to 4 carbon atoms, and wherein said compound represented by formula (IIa) is present in an amount of from 5 to 50 parts by weight per 100 parts by weight of the polyimide precursor, drying the resulting coating to form a film on the substrate, irradiating the resulting film with actinic rays through a photomask, heat-treating the irradiated film at a temperature of about 170° C. or more, and removing unexposed areas of the film by development with an alkaline developing solution, wherein the step of heat treating the irradiated film at a temperature of about 170° C. or more is conducted after the film is irradiated and before the film is developed.

2. A process as claimed in claim 1, wherein said compound represented by formula (IIa) is present in an amount of from 10 to 25 parts by weight per 100 parts by weight of the polyimide precursor.

3. A process as claimed in claim 1, wherein said compound is 2,6-dimethyl-3,5-diacetyl-4-(2'-nitrophenyl)-1,4-dihydropyridine.

* * * * *